(12) United States Patent
Satoh

(10) Patent No.: US 6,342,694 B1
(45) Date of Patent: Jan. 29, 2002

(54) ADJUSTABLE-FREE OPTICAL SIGNAL RECEIVER

(75) Inventor: Hideaki Satoh, Tokyo (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/276,677

(22) Filed: Mar. 26, 1999

(30) Foreign Application Priority Data

Aug. 25, 1998 (JP) .............................. 10-238492

(51) Int. Cl.$^7$ ................................. H01J 40/14
(52) U.S. Cl. .......................... 250/214 A; 250/214 AG; 330/308
(58) Field of Search ................... 250/214 R, 214 A, 250/214 AG; 330/308

(56) References Cited

U.S. PATENT DOCUMENTS 6,084,478 A * 7/2000 Mayampurath ............ 330/308

FOREIGN PATENT DOCUMENTS

| JP | 5-227104 | 9/1993 |
| JP | 8-102716 | 4/1996 |

* cited by examiner

*Primary Examiner*—F. L. Evans
(74) *Attorney, Agent, or Firm*—Rabin & Berdo, P.C.

(57) ABSTRACT

An optical signal receiver producing an output signal from a received optical signal also generates two complementary signals from the output signal, integrates the two complementary signals, and takes the difference between the two integrated signals. The difference signal is used to control a bias current supplied to the input terminal of an amplifier that generates the output signal signal. Alternatively, the difference signal controls the gain of the amplifier. Output distortion is thereby corrected without requiring external adjustments.

16 Claims, 8 Drawing Sheets

FIG.9

ADJUSTABLE-FREE OPTICAL SIGNAL RECEIVER

BACKGROUND OF THE INVENTION

The present invention relates to an optical signal receiver with improved self-adjusting capabilities.

Figure 1:
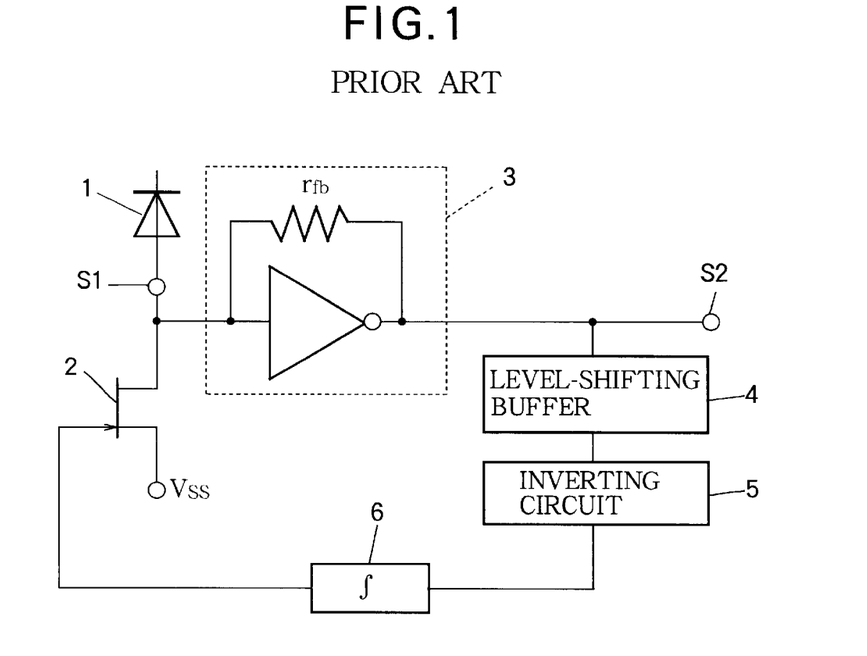
FIG. 1 is a circuit diagram of a convention optical signal receiver.

Referring to FIG. 1, a conventional optical signal receiver comprises a photodiode 1, an n-channel junction field-effect transistor (FET) 2, and a transimpedance amplifier 3 including a feedback resistor $r_{fb}$. The photodiode 1 is illuminated by the received optical signal, and generates a varying signal current at node S1. The FET 2 sinks a constant bias current. The transimpedance amplifier 3 receives the net difference between the signal current and bias current, and generates an output voltage at node S2.

To prevent distortion of the output voltage signal, the bias current must be adjusted so that the net current entering the amplifier 3 varies within the linear operating range of the amplifier 3. Performing this adjustment externally would be inconvenient, and would require readjustment when the operating environment changed, so the receiver preferably has a built-in circuit that adjusts the bias current automatically.

The self-adjusting circuit in a conventional receiver comprises a level-shifting buffer 4, an inverting circuit 5, and an integrating circuit 6 coupled in cascade between the output node S2 and the gate of the FET 2. The level-shifting buffer 4 and inverting circuit 5 are necessary because the amplifier 3 operates with negative gain. The integrating circuit 6 provides the FET 2 with a gate voltage responsive to the average optical signal level. At high average optical signal levels, the gate voltage rises, and the bias current becomes high enough to keep the amplifier 3 from saturating.

To work well, however, the conventional receiver needs to be manufactured to extremely tight tolerances, because the bias current depends on the operating characteristics of the level-shifting buffer 4 and inverting circuit 5, which are sensitive to variations in the fabrication process. Moreover, the operating characteristics of the level-shifting buffer 4 and inverting circuit 5 are sensitive to ambient temperature during operation. In practice, the fabrication process and operating environment cannot always be controlled as closely as necessary, the bias current is sometimes inadequate or over-adequate, and the amplifier 3 sometimes saturates, leading to distortion of the output signal.

Needless to say, using an external adjustment to compensate for variations in the operating characteristics of the level-shifting buffer 4 and inverting circuit 5 would not be a satisfactory solution to this problem.

SUMMARY OF THE INVENTION

An object of the present invention is to prevent output distortion in an optical signal receiver.

A further object is to prevent output distortion without requiring external adjustments.

The invented optical signal receiver has a photosensitive element generating a signal current, an amplifier generating an output signal from the signal current, and circuits for automatically adjusting the amplifier by the steps of:

(a) generating two complementary signals from the output signal;

(b) integrating the two complementary signals;

(c) taking the difference between the two integrated signals, thereby obtaining a difference signal; and (d) adjusting the amplifier according to the difference signal.

Step (d) can be carried out by adjusting a bias current supplied to the amplifier, or by adjusting the gain of the amplifier.

By integrating two complementary signals, the invented optical signal receiver controls the amplifier so as to eliminate output signal distortion in a manner not affected by fabrication-process variations or ambient conditions, without requiring external adjustment.

DETAILED DESCRIPTION OF THE INVENTION

Embodiments of the invention will be described with reference to the attached drawings, in which like parts are indicated by like reference characters.

Figure 2:
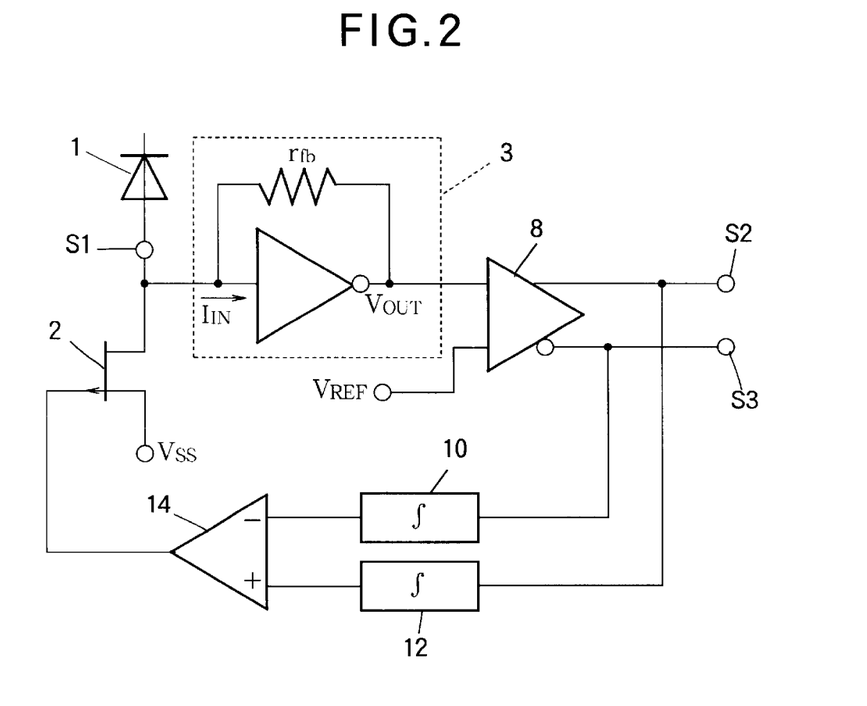
FIG. 2 is a circuit diagram of a first embodiment of the invention.

Referring to FIG. 2, the first embodiment is an optical signal receiver comprising a photodiode 1, a p-channel junction FET 2, and a transimpedance amplifier 3, which operate substantially as in the conventional receiver already described. Node S1 is coupled to the anode of the photodiode 1, the drain of the FET 2, and the input terminal of the transimpedance amplifier 3. $I_{IN}$ denotes the net current input to the transimpedance amplifier 3; that is, the algebraic sum of the positive signal current output from the photodiode 1 and the negative bias current sunk by the FET 2. $V_{OUT}$ denotes the output voltage of the transimpedance amplifier 3. $V_{ss}$ denotes the source potential of the FET 2, which is generated by an external power supply (not visible).

The first embodiment also comprises a differential amplifier 8 that takes the difference between the output voltage $V_{OUT}$ and an externally supplied reference voltage $V_{REF}$, such as a ground voltage or another appropriate voltage. The differential amplifier 8 has a non-inverting output terminal coupled to an output node S2, and an inverting output terminal coupled to an output node S3, and generates two complementary voltage signals at these two nodes.

The first embodiment further comprises a first integrating circuit 10 that integrates the voltage signal output to node S3, and a second integrating circuit 12 that integrates the voltage signal output to node S2.

The first embodiment also has a difference amplifier 14 that receives the two integrated signals generated by the integrating circuits 10, 12 and generates a difference signal responsive to the difference between the integrated signals. The difference signal is supplied to the gate of the FET 2, and controls the input bias current supplied to the transimpedance amplifier 3.

Next, the operation of the first embodiment will be described.

Figure 3:
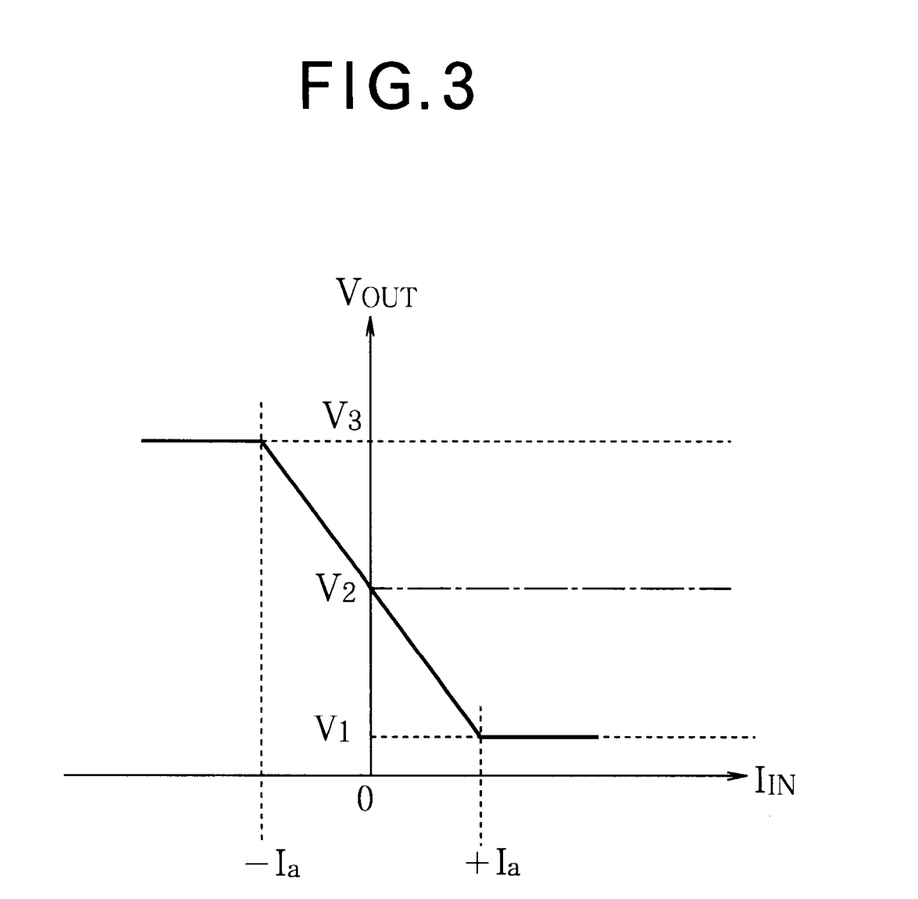
FIG. 3 is a graph of the input-output characteristic of the transimpedance amplifier in the first embodiment.

FIG. 3 illustrates, in an idealized manner, the operating characteristic of the transimpedance amplifier 3, showing input current $I_{IN}$ on the horizontal axis, and output voltage $V_{OUT}$ on the vertical axis. The transimpedance amplifier 3 operates as an inverting amplifier with gain determined by the feedback resistor $r_{fb}$, saturating at input currents exceeding a certain absolute current value $I_a$. The operating characteristic is linear for input currents from $-I_a$ to $+I_a$. Input current values $+I_a$, $0$, $-I_a$ produce output voltages $V_1$, $V_2$, $V_3$, respectively.

Figure 4:
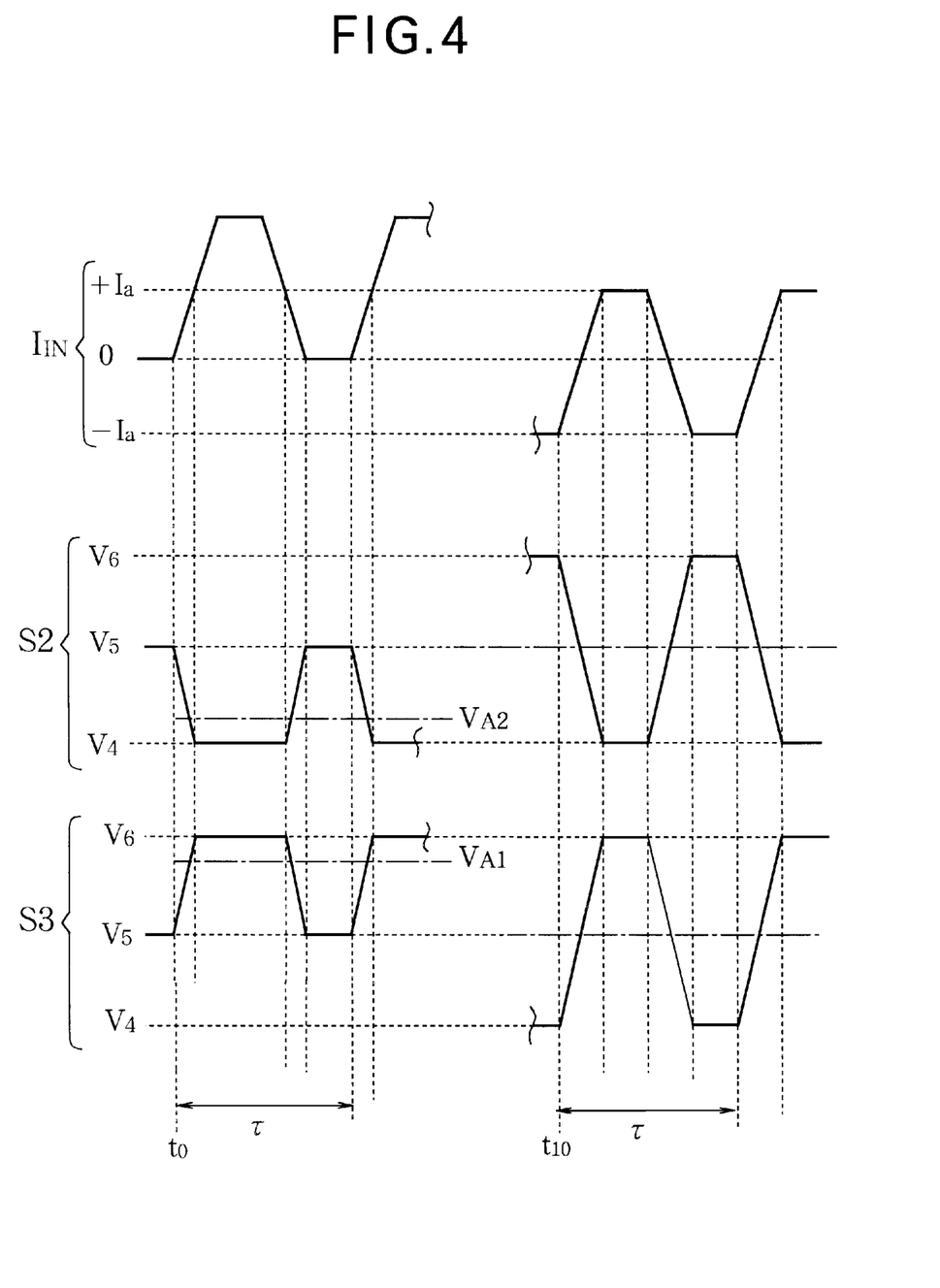
FIG. 4 is a waveform diagram illustrating the operation of the first embodiment.

FIG. 4 relates the input current $I_{IN}$ to the voltage outputs at nodes S2 and S3. The horizontal axis represents time. $V_4$, $V_5$, and $V_6$ are the voltages at node S2 corresponding to voltages $V_1$, $V_2$, and $V_3$ output from the transimpedance amplifier 3. The optical input signal is a periodic test signal with period τ and a fifty-percent duty cycle. In practice, the input signal is not periodic, but has an average duty cycle of fifty percent.

At an initial time $t_0$, the outputs of both integrating circuits 10, 12 are zero, the difference signal output by the difference amplifier 14 is zero, the FET 2 is switched off, and the transimpedance amplifier 3 receives only signal current from the photodiode 1. In the drawing, the amplitude of the input current $I_{IN}$ is equal to $2I_a$. During the part of each signal period in which the input current value exceeds $I_a$, the transimpedance amplifier 3 saturates. The output signal waveforms at nodes S2 and S3 are consequently distorted, having duty cycles different from fifty percent.

As this state continues, the output of the first integrating circuit 10 moves toward the average value $(V_{A1})$ of the signal at node S3, while the output of the second integrating circuit 12 moves in the opposite direction, toward the complementary average value $(V_{A2})$ of the signal at node S2. Subtracting the output of the first integrating circuit from the output of the second integrating circuit, the difference amplifier 14 obtains an increasingly negative difference signal that becomes large enough to turn on the FET 2. The transimpedance amplifier 3 then begins to receive a negative bias current from the FET 2, in addition to the positive signal current from the photodiode 1.

As long as the average signal level at node S3 exceeds the average signal level at node S2, the difference between the outputs of the two integrating circuits 10, 12 continues to increase, and the bias current flow increases likewise. When the bias current reaches $-I_a$, at time $t_{10}$, the input current received by the transimpedance amplifier 3 is centered at zero, the complementary signals at nodes S2 and S3 are both centered at $V_5$, and the difference between the outputs of the two integrating circuits ceases to change. The difference amplifier 14 then outputs a constant difference signal that holds the bias current at $-I_a$. The transimpedance amplifier 3 now operates within its linear range, the output voltage $V_{OUT}$ is undistorted, and the output waveforms at nodes S2 and S3 are also undistorted.

Figure 5:
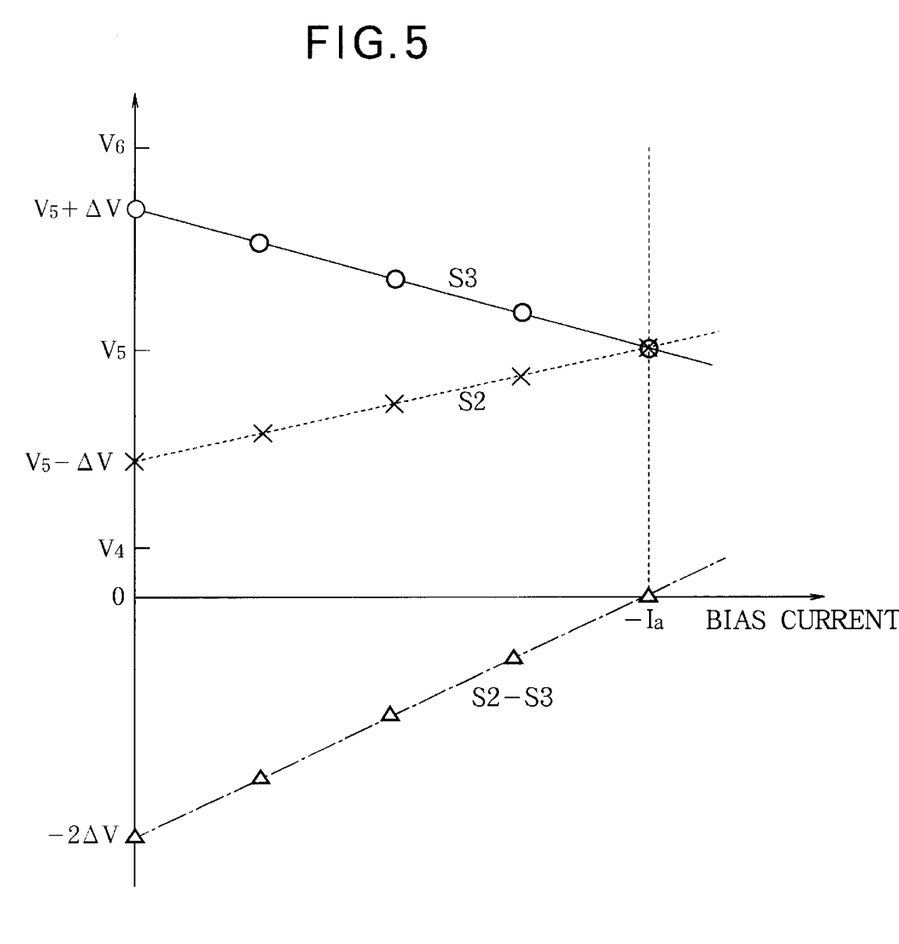
FIG. 5 is a graph further illustrating the operation of the first embodiment.

FIG. 5 illustrates the above operation as a function of the bias current, indicated as a negative value on the horizontal axis. The vertical axis indicates the average voltage levels at nodes S2 and S3, and the difference between the two levels. With zero bias current, the average voltage level at node S2 is $V_5-\Delta V$, the average voltage level at node S3 is $V_5+\Delta V$, and the difference (S2−S3) is $2\Delta V$. As the bias current increases to $-I_a$, the difference is reduced to zero.

This operation requires that the two integrating circuits 10, 12 have similar operating characteristics. This requirement is normally met, because both integrating circuits are affected in the same way by variations in the fabrication process and by ambient temperature. The first embodiment is therefore a robust optical signal receiver that keeps the input current $I_{IN}$ centered in the linear range of the transimpedance amplifier 3 without requiring external bias adjustment.

It is necessary, however, to provide an appropriate reference voltage to the differential amplifier 8.

Next, a second embodiment will be described.

Figure 6:
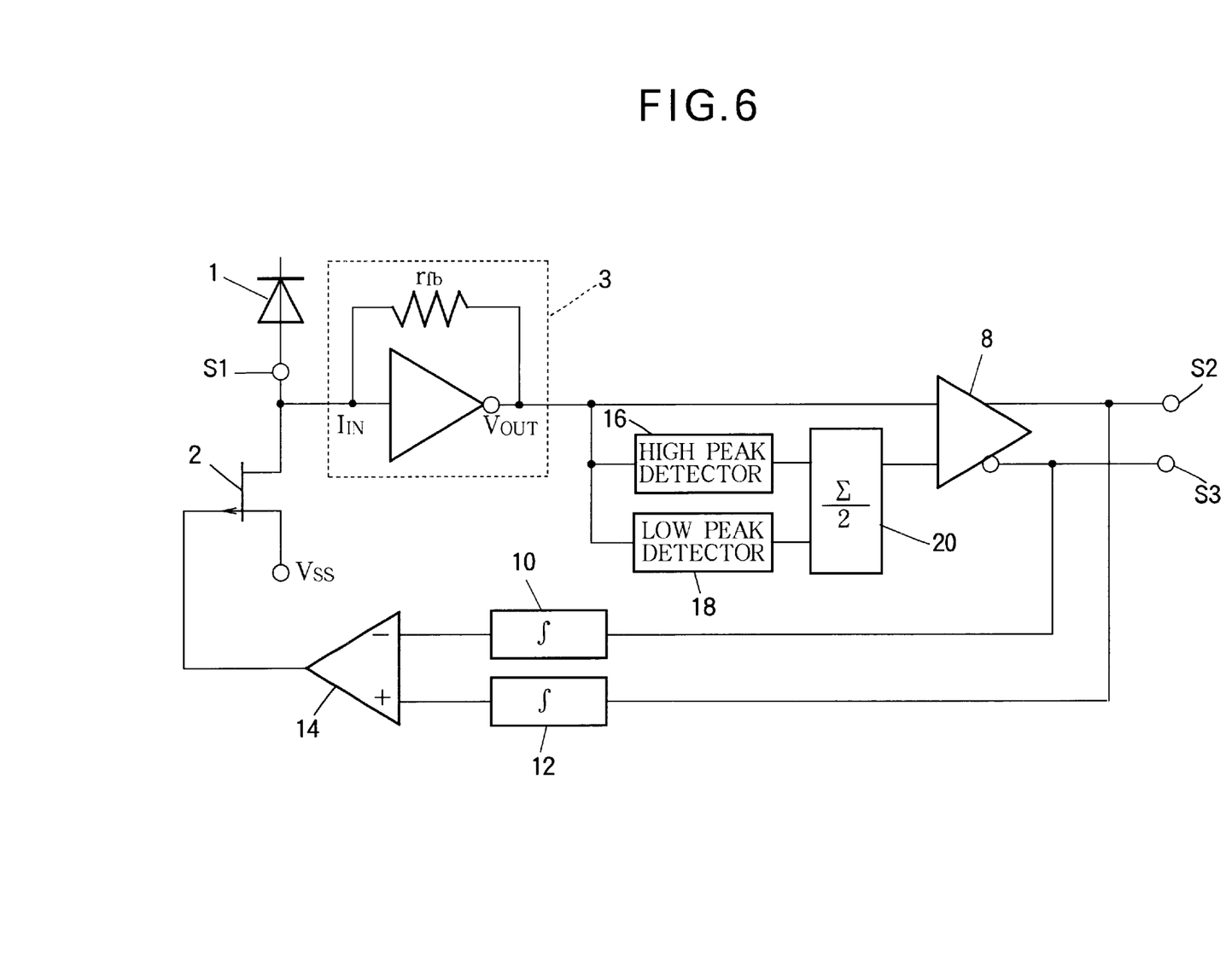
FIG. 6 is a circuit diagram of a second embodiment of the invention.

Referring to FIG. 6, in addition to the elements present in the first embodiment, the second embodiment has a high peak detector 16, a low peak detector 18, and a summing circuit 20. The high peak detector 16 and low peak detector 18 both receive the output voltage $V_{OUT}$ of the transimpedance amplifier 3. The summing circuit 20 receives the high peak value of the output voltage $V_{OUT}$, as detected by of the high peak detector 16, and the low peak value of the output voltage $V_{OUT}$, as detected by of the low peak detector 18. The summing circuit 20 generates a mean value equal to one-half the sum of the two peak values, thus to the center value of the output voltage $V_{OUT}$. This center value is supplied to the differential amplifier 8 in place of the reference voltage in the first embodiment.

Using the center value of $V_{OUT}$ as the reference input to the differential amplifier 8 centers the signals at both nodes S2 and S3 around voltage $V_5$ in FIG. 4. If $V_{OUT}$ is distorted and its average duty cycle is not fifty percent, then the average duty cycles of the signals at nodes S2 and S3 will also differ from fifty percent, in mutually opposite directions. The difference between the outputs of the integrating circuits 10, 12 will then change, and the difference amplifier 14 will alter the bias current conducted by the FET 2 so as to correct the distortion.

The second embodiment operates in essentially the same way as the first embodiment, but is completely adjustment-free, as neither the bias current nor the reference voltage has to be externally adjusted.

Next, a third embodiment will be described.

Figure 7:
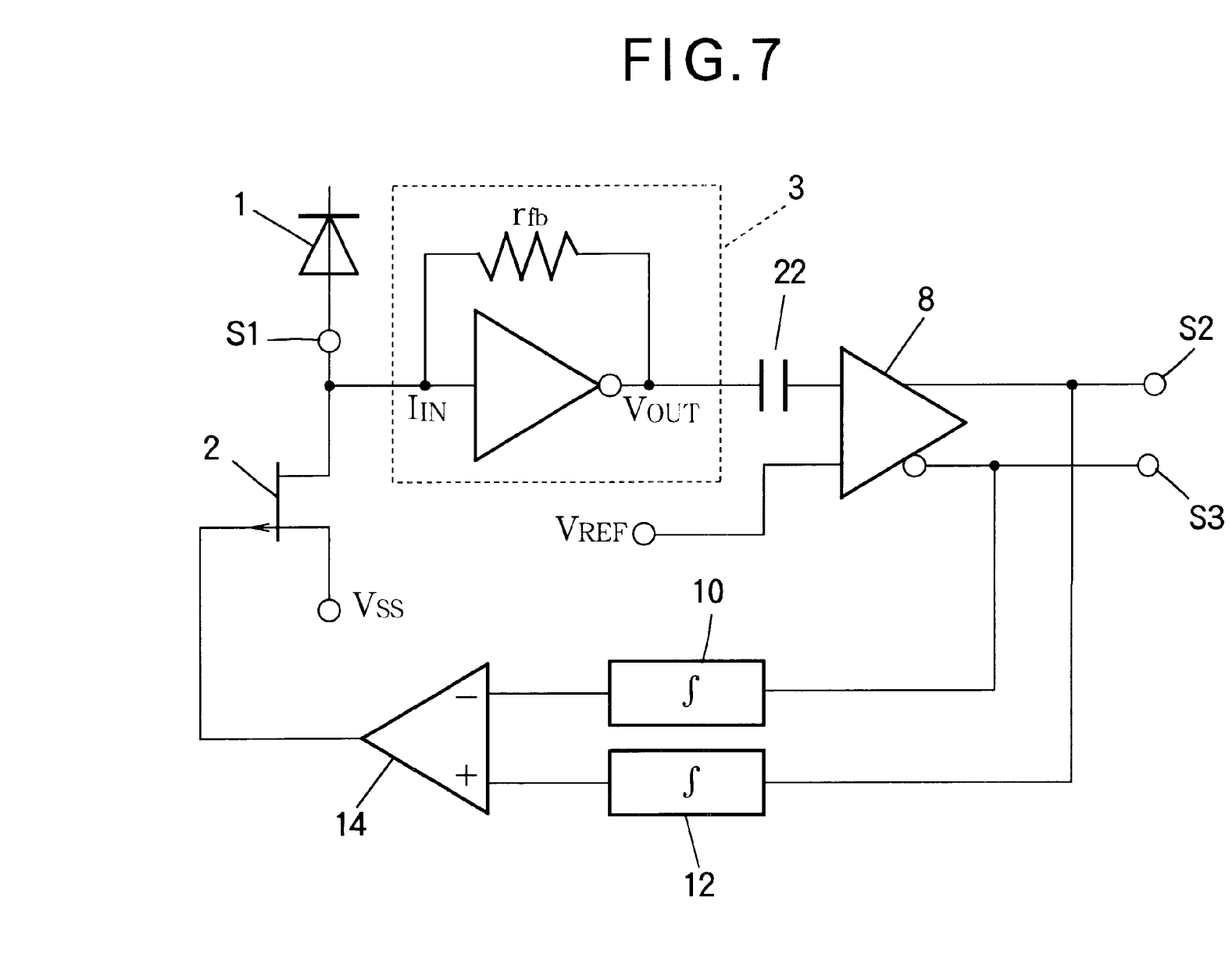
FIG. 7 is a circuit diagram of a third embodiment of the invention.

Referring to FIG. 7, the third embodiment inserts a capacitor 22 in series between the transimpedance amplifier 3 and differential amplifier 8 of the first embodiment.

The capacitive coupling between the transimpedance amplifier 3 and differential amplifier 8 blocks the direct-current component of the output of the transimpedance amplifier 3. Consequently, the differential amplifier 8 sees an input voltage that varies around a center value set by the internal input circuits (not visible) of the differential amplifier 8 itself, rather than by the internal output circuits (not visible) of the transimpedance amplifier 3.

The third embodiment enables the internal structure of the transimpedance amplifier 3 to be simplified, because no level-shifting buffer or the like is needed to bias the output of the transimpedance amplifier 3 to match the input requirements of the differential amplifier 8. The operation of the receiver is also made insensitive to variations in the output bias of the transimpedance amplifier 3, increasing the robustness of the receiver design.

Next, a fourth embodiment will be described.

Figure 8:
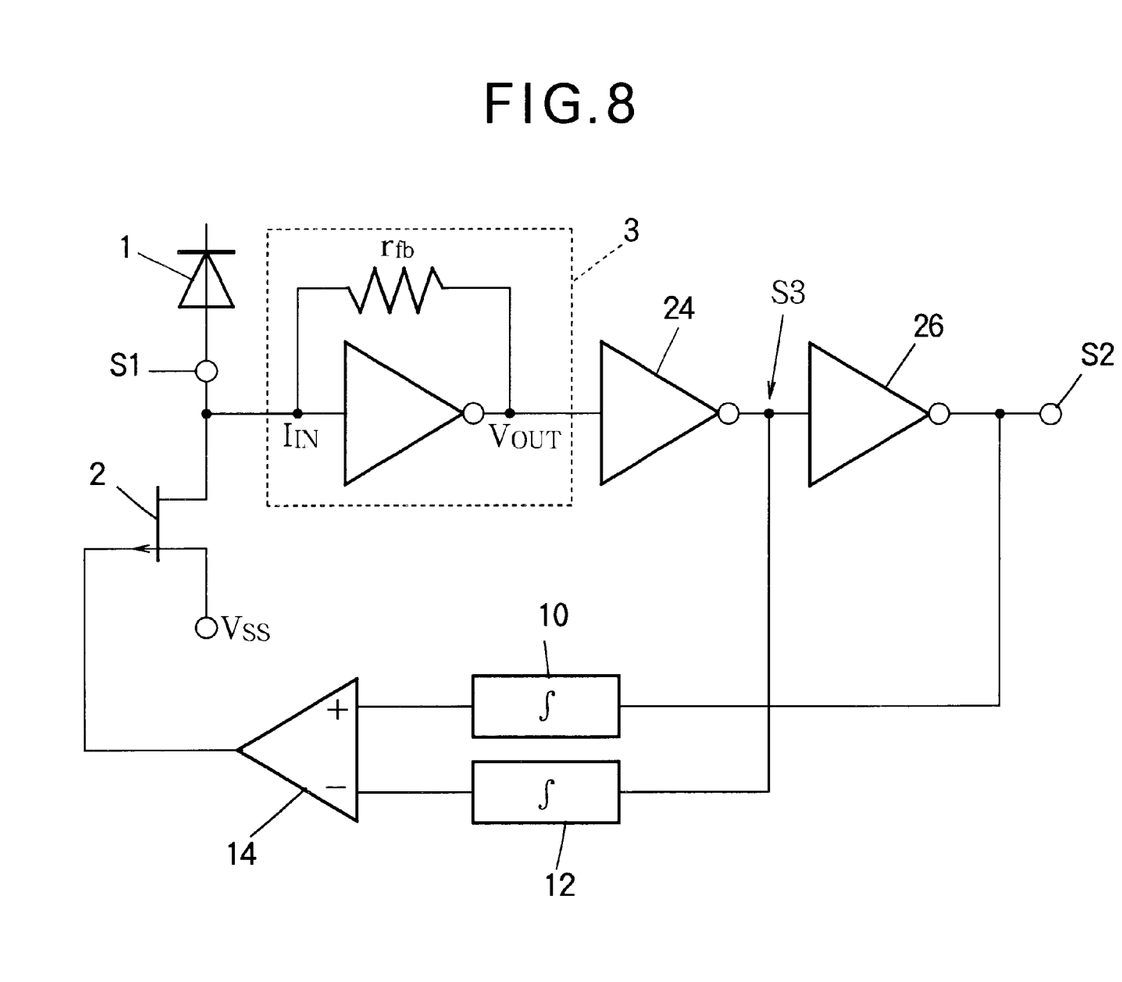
FIG. 8 is a circuit diagram of a fourth embodiment of the invention.

Referring to FIG. 8, the fourth embodiment replaces the differential amplifier 8 of the first embodiment with a cascaded pair of single-ended inverting amplifiers 24, 26. The input terminal of the first inverting amplifier 24 is coupled to the output terminal of the transimpedance amplifier 3. The output terminal of the first inverting amplifier 24 is coupled to the input terminal of the second inverting amplifier 26 at node S3. The output terminal of the second inverting amplifier 26 is coupled to node S2. Nodes S3 and S2 are coupled to integrating circuits 10 and 12 as in the first embodiment.

The fourth embodiment is designed to operate at a relatively high input signal amplitude level, and the inverting amplifiers 24, 26 are designed to saturate when the input signal has the expected high amplitude. The two integrating circuits 10, 12 receive complementary signals similar to high and low logic signals. The two complementary signals have complementary average duty cycles, the average duty cycle at node S2 matching the average duty cycle of the output $V_{OUT}$ of the transimpedance amplifier 3.

The fourth embodiment operates in essentially the same way as the preceding embodiments, but provides saturated output signal levels at nodes S2 and S3. The advantage is that the output signal levels are substantially unaffected by variations in the threshold voltages of field-effect transistors (not visible) used in the inverting amplifiers 24, 26. In a differential amplifier, variations in transistor threshold voltages can offset the output signal levels to a certain extent.

Next, a fifth embodiment will be described.

Figure 9:
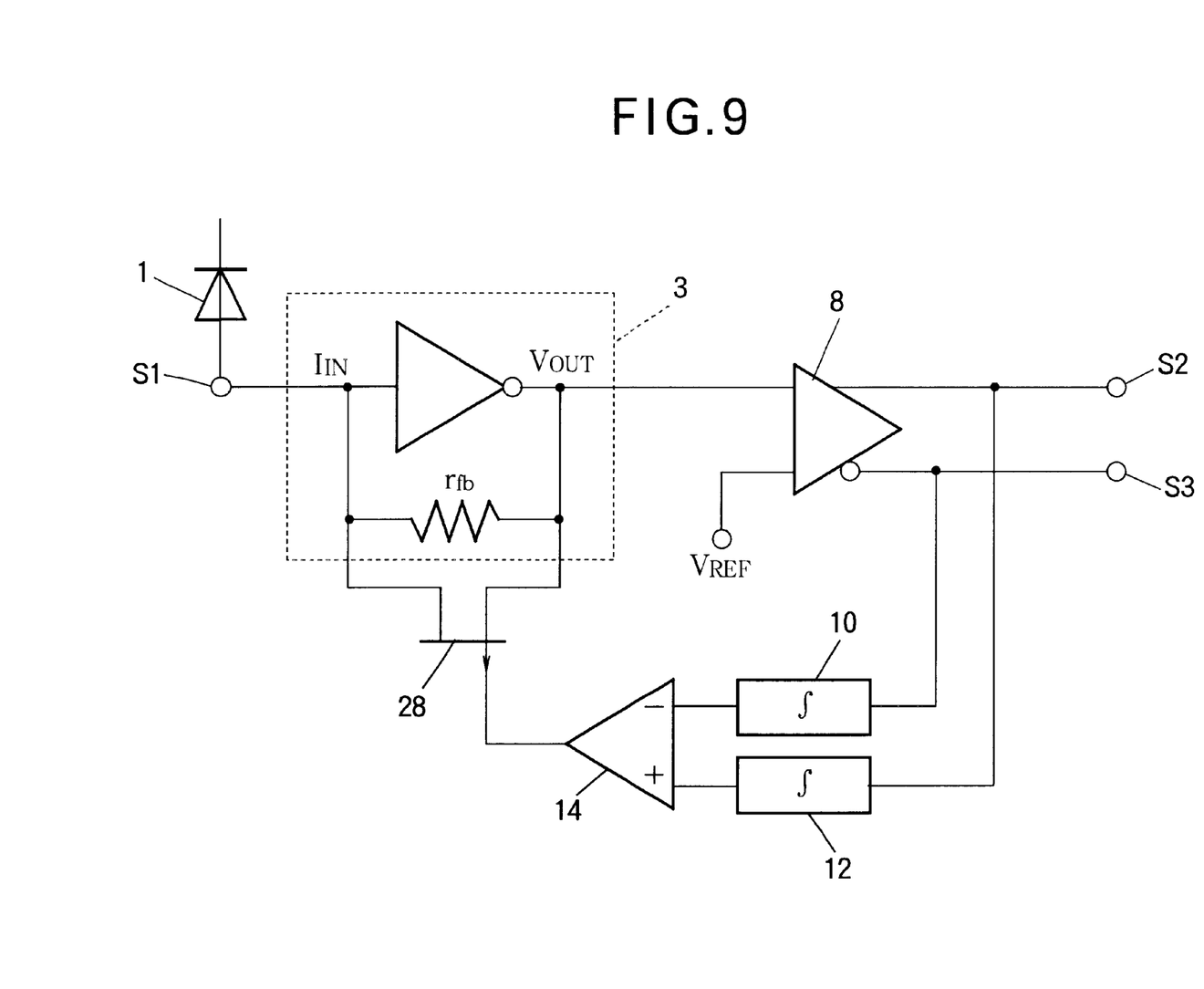
FIG. 9 is a circuit diagram of a fifth embodiment of the invention.

Referring to FIG. 9, the fifth embodiment has the same differential amplifier 8, integrating circuits 10, 12, and difference amplifier 14 as the first embodiment, but supplies the output of the difference amplifier 14 to the gate of a p-channel junction FET 28 coupled between the input and output terminals of the transimpedance amplifier 3, in parallel with the feedback resistor $r_{fb}$. This FET 28 controls the gain of the transimpedance amplifier 3.

If, for example, the average level of the S3 output increases in relation to the average level of the S2 output, due to distortion as shown at time $t_0$ in FIG. 4, then the output of the difference amplifier 14 falls. The conductance of the FET 28 then increases, reducing the transimpedance or gain of the transimpedance amplifier 3. The amplitude of the output voltage $V_{OUT}$ is thereby reduced, until the distortion is eliminated.

Whereas the preceding embodiments shifted the input current $I_{IN}$ to stay within the linear operating range of the transimpedance amplifier 3, the fifth embodiment enlarges the linear operating range to accommodate the input current $I_{IN}$. The internal operation of the differential amplifier 8, integrating circuits 10, 12, and difference amplifier 14 is the same as in the first embodiment, providing an optical signal receiver that is robust with respect to process and temperature variations.

The above embodiments have been described separately, but their features can be combined in various ways. For example, the features of the second, third, or fourth embodiment can be used in the fifth embodiment.

Any of the preceding embodiments can be modified by substituting n-channel for p-channel transistors, provided the input connections of the two integrating circuits are reversed.

Those skilled in the art will recognize that further variations are possible within the scope claimed below.

What is claimed is:

1. A method of automatically adjusting an optical signal receiver having a photosensitive element generating a signal current and an amplifier generating an output signal from the signal current, comprising the steps of:

(a) generating two complementary signals from said output signal;
   (b) integrating said two complementary signals, thereby obtaining two integrated signals;
   (c) taking a difference between said two integrated signals, thereby obtaining a difference signal; and
   (d) adjusting said amplifier according to said difference signal.

2. The method of claim 1, wherein said step (d) comprises adjusting an input bias current supplied to said amplifier.

3. The method of claim 1, wherein said step (d) comprises adjusting a gain of said amplifier.

4. The method of claim 1, wherein said step (a) comprises the further steps of:

inverting said output signal, thereby obtaining one of said two complementary signals; and
   inverting said one of said two complementary signals, thereby obtaining another one of said two complementary signals.

5. The method of claim 1, wherein said step (a) comprises comparing said output signal with a reference signal.

6. The method of claim 5, further comprising the steps of:

detecting a high peak value in said output signal;
   detecting a low peak value in said output signal; and
   using a mean value of said high peak value and said low peak value as said reference signal.

7. An optical signal receiver receiving an optical signal and generating an output voltage, comprising:

a photosensitive element receiving said optical signal and generating a signal current;
   a transimpedance amplifier coupled to said photosensitive element, receiving said signal current and a bias current, generating an output voltage responsive to an algebraic sum of said signal current and said bias current;
   an inverting circuit coupled to said transimpedance amplifier, generating two complementary signals responsive to said output voltage;
   a first integrating circuit coupled to said inverting circuit, obtaining a first integrated value of one of said two complementary signals;
   a second integrating circuit coupled to said inverting circuit, obtaining a second integrated value of another one of said two complementary signals;
   a difference circuit coupled to said first and second integrating circuits, generating a difference signal responsive to a difference between said first integrated value and said second integrated value; and
   a bias control circuit coupled to said difference circuit, controlling said bias current according to said difference signal.

8. The optical signal receiver of claim 7, wherein said bias control circuit comprises a field-effect transistor having a gate receiving said difference signal, a source receiving a power-supply voltage, and a drain coupled to said transimpedance amplifier.

9. The optical signal receiver of claim 7, wherein said inverting circuit comprises a differential amplifier receiving the output voltage of said transimpedance amplifier and a reference voltage, and generating said pair of complementary signals according to a difference between said output voltage and said reference voltage.

10. The optical signal receiver of claim 9, further comprising:

a high peak detector receiving the output voltage of said transimpedance amplifier and detecting a high peak value therein;

a low peak detector receiving the output voltage of said transimpedance amplifier and detecting a low peak value therein; and a summing circuit taking a sum of said high peak value and said low peak value, and supplying one-half of said sum to said differential amplifier as said reference voltage.

11. The optical signal receiver of claim 7, wherein said inverting circuit comprises a cascaded pair of inverting amplifiers.

12. The optical signal receiver of claim 7, further comprising a capacitor coupled in series between said transimpedance amplifier and said inverting circuit.

13. An optical signal receiver receiving an optical signal and generating an output voltage, comprising:

a photosensitive element receiving said optical signal and generating a signal current;

a transimpedance amplifier coupled to said photosensitive element, receiving said signal current and generating an output voltage, responsive to said signal current, with a controllable gain;

an inverting circuit coupled to said transimpedance amplifier, generating two complementary signals responsive to said output voltage;

a first integrating circuit coupled to said inverting circuit, obtaining a first integrated value of one of said two complementary signals;

a second integrating circuit coupled to said inverting circuit, obtaining a second integrated value of another one of said two complementary signals;

a difference circuit coupled to said first and second integrating circuits, generating a difference signal responsive to a difference between said first integrated value and said second integrated value; and a gain control circuit coupled to said difference circuit, controlling the gain of said transimpedance amplifier according to said difference signal.

14. The optical signal receiver of claim 13, wherein said inverting circuit comprises a differential amplifier receiving the output voltage of said transimpedance amplifier and a reference voltage, and generating said pair of complementary signals according to a difference between said output voltage and said reference voltage.

15. The optical signal receiver of claim 13, wherein said transimpedance amplifier has an input terminal and an output terminal, and said gain control circuit provides feedback from said output terminal to said input terminal.

16. The optical signal receiver of claim 15, wherein said gain control circuit comprises a field-effect transistor coupled between said output terminal and said input terminal, having a gate receiving said difference signal.

* * * * *